United States Patent [19]

Hong et al.

[11] Patent Number: 5,504,021
[45] Date of Patent: Apr. 2, 1996

[54] METHOD OF FABRICATING THIN O/N/O STACKED DIELECTRIC FOR HIGH-DENSITY DRAMS

[75] Inventors: Gary Hong, Hsinchu; Huang-Chung Cheng, Tainan; Huan-Ping Su, Taipei; Han-Wen Liu, Taichung, all of Taiwan

[73] Assignee: United Microelectronics Corp., Hsinchu, Taiwan

[21] Appl. No.: 290,359

[22] Filed: Aug. 15, 1994

[30] Foreign Application Priority Data

Apr. 8, 1994 [TW] Taiwan ................................ 83103081

[51] Int. Cl.$^6$ .................................................. H01L 21/70
[52] U.S. Cl. ............................ 437/42; 437/239; 437/242; 437/920; 437/52; 437/978
[58] Field of Search ............................... 437/920, 978, 437/919, 42, 52, 239, 238, 241, 242, 941; 148/DIG. 156, DIG. 118

[56] References Cited

U.S. PATENT DOCUMENTS

| | | | |
|---|---|---|---|
| 4,980,307 | 12/1990 | Ito et al. | 437/40 |
| 5,013,692 | 5/1991 | Ide et al. | 437/242 |
| 5,032,545 | 7/1991 | Doan et al. | 437/242 |
| 5,153,685 | 10/1992 | Murata et al. | 357/236 |
| 5,219,773 | 6/1993 | Dunn | 437/43 |
| 5,244,825 | 9/1993 | Coleman et al. | 437/52 |
| 5,250,456 | 10/1993 | Byrant | 437/241 |
| 5,254,506 | 10/1993 | Hori | 437/242 |
| 5,298,333 | 11/1993 | Shappir et al. | 437/235 |
| 5,330,935 | 7/1994 | Dobuzinsky et al. | 437/239 |
| 5,350,707 | 9/1994 | Ko et al. | 437/52 |
| 5,378,645 | 1/1995 | Inoue et al. | 437/238 |
| 5,397,748 | 3/1995 | Watanabe et al. | 437/239 |
| 5,434,109 | 7/1995 | Geissler et al. | 437/420 |

FOREIGN PATENT DOCUMENTS 58-90778   5/1983   Japan ................................. 257/411

*Primary Examiner*—George Fourson
*Assistant Examiner*—S. Mulpuri
*Attorney, Agent, or Firm*—Ladas & Parry

[57] ABSTRACT

A method of fabricating a super thin O/N/O stacked dielectric by oxidizing a thin nitride layer in low pressure oxygen for high-density DRAMs is disclosed. A thin nitride layer with a thickness of approximately 20 Å to 60 Å is formed over the surface of a silicon substrate. The nitride layer is oxidized in pure oxygen ambient of 0.01 Torr to 76 Torr at a temperature from 750° C. to 950° C. for approximately 10 to 60 minutes. A super thin oxide/nitride/oxide (O/N/O) stacked dielectric exhibiting a low leakage current and high reliability for use in high-density DRAMs is formed by the aforementioned low-pressure dry-oxidation procedure.

2 Claims, 5 Drawing Sheets

METHOD OF FABRICATING THIN O/N/O STACKED DIELECTRIC FOR HIGH-DENSITY DRAMS

BACKGROUND OF THE INVENTION

1. Field of the Invention

This invention relates to the formation of a dielectric in integrated circuit devices, and more particularly, to a method of fabricating a super thin O/N/O stacked dielectric by oxidizing a thin nitride layer in low pressure oxygen for high-density DRAMs.

2. Description of the Prior Art

Dynamic random access memory (DRAM) has been widely utilized in integrated circuit (IC) devices and is typically used in computer systems. A conventional memory cell used in high capacity DRAM IC devices includes, as are shown in FIG. 2, a metal-oxide semiconductor field-effect transistor (MOSFET) 10 and a capacitor 12. The gate of the MOSFET 10 is connected to a word line (WL) of the memory IC device. The drain and source regions of the MOSFET 10 are connected, Respectively, to a bit line (BL) of the memory IC device and to ground potential through the capacitor 12. The capacitor 12 of each memory cell is utilized to store data, either a ONE or a ZERO, which is determined by whether or not the capacitor 12 is being charged or discharged. Due to the inherent nature of the DRAM design, the capacitor should have a high capacitance in order to maintain its data for as long a time as possible.

As is well known to persons in this art, the capacitance of the capacitor 12 is directly proportional to the dielectric constant and the surface area of the dielectric layer of the capacitor 12. That is, increasing the surface area or decreasing the thickness of the dielectric layer will increase the capacitance of the capacitor 12. As the density of devices in ICs increases, the area that each device occupies becomes smaller. The resulting smaller capacitors are characterized by a lower capacitance which decreases the time during which the capacitors will store data. Accordingly, it is necessary to use a dielectric with a smaller thickness to improve the capacitance of the capacitors.

In 4 MB and 16 MB DRAM technology, oxide/nitride (O/N) stacked dielectric materials formed by wet-oxidizing a thin nitride ($Si_3N_4$) layer for a short duration have been extensively applied to establish a low defect density on the wafer surface and bulk-limited current (which results in a low leakage current and a high breakdown voltage), As currently practiced, such a wet-oxidized nitride cannot be utilized in 64 MB and 256 MB DRAMs because its effective oxide thickness cannot be reduced below 55 Å. Hence, a tantalum pentoxide ($Ta_2O_5$) dielectric having a high dielectric constant was studied by G. Q. Lo et al, IEEE Electron Device Letter, vol. EDL-14, no. 5, pp. 216–218 to meet the requirement of 64 MB and 265 MB DRAMs. However, the high leakage current exhibited by a tantalum pentoxide dielectric is still a problem to be solved.

SUMMARY OF THE INVENTION

A principal object of the present invention is to provide an effective method of forming a dielectric for high-density DRAMs.

Another object of the present invention is to provide a method of fabricating a dielectric with low leakage current and high reliability for high-density DRAMs.

In accordance with the objects of the present invention, a new method of fabricating a super thin O/N/O stacked dielectric by oxidizing a thin nitride layer in low pressure oxygen for high-density DRAMs is achieved. A thin nitride layer with a thickness of approximately 20 Å to 60 Å is formed over the surface of a silicon substrate. The nitride layer is oxidized in pure oxygen ambient of 0.01 Torr to 76 Torr at a temperature from 750° C. to 950° C. for approximately 10 to 60 minutes. A super thin oxide/nitride/oxide (O/N/O) stacked dielectric is then formed by the above low-pressure dry-oxidation procedure.

BRIEF DESCRIPTION OF THE DRAWINGS

The present invention is more fully understood from the detailed description provided hereinafter with reference to the accompanying drawings which are given by way of illustration only, and thus not limitative of the present invention and wherein.

DESCRIPTION OF THE PREFERRED EMBODIMENT

Process Technology

Figure 1A:
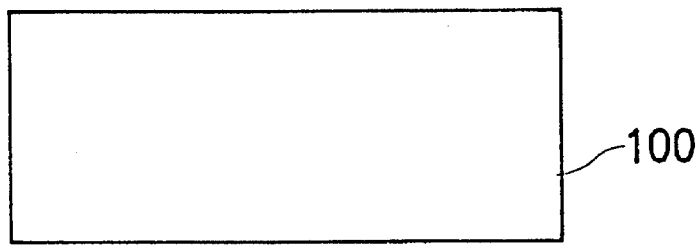
FIG. 1(a)–1(c) show diagramically a silicon substrate or wafer during the formation of a thin O/N/O dielectric thereon.
Figure 1B:
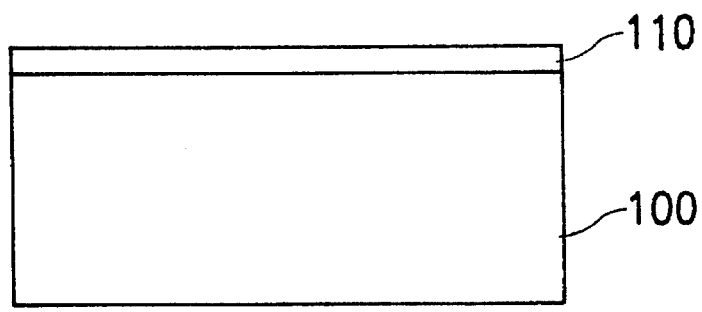
Figure 1C:
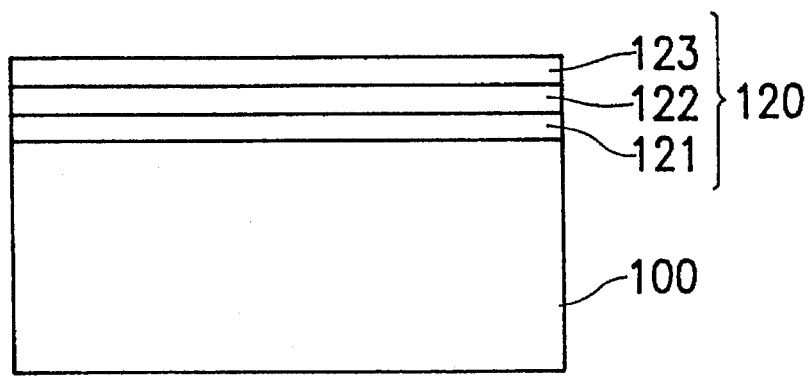

Referring initially to FIGS. 1(a) through 1(c), both P-type conductivity and N-type conductivity silicon wafers 100 may be used in the following embodiments. The preferred method first involves performing an "RCA method" cleaning procedure (where bare silicon or a silicon wafer with only thermally grown oxide is chemically cleaned by procedures well known in the art) on silicon wafers 100.

Thereafter, the wafers 100 are immersed in diluted-HF solutions and immediately loaded into a low-pressure chemical vapor deposition (LPCVD) system to avoid native oxide growth. The LPCVD nitride deposition is performed at 750° C. as many times as necessary to obtain a nitride layer 110 having a thickness ranging from 20 Å to 60 Å and preferably equal to about 42 Å.

Next, the thin nitride layer is oxidized. It has been found that different oxidation schemes produce O/N/O stacked dielectric materials varying in their respective characteristics. Since the thickness of the nitride layer is very thin, when it is subsequently subjected to oxidation, oxygen atoms diffuse through the nitride layer and react with the substrate to form a silicon oxide layer 121 between the remaining nitride 122 and the underlying substrate 100. An oxide layer 123 also forms on the surface of the nitride layer, hence the resulting structure has a oxide/nitride/oxide 121, 122, 123 (or O/N/O) configuration. If the nitride is thicker than about 60 Å, then the nitride tends to block the oxygen and an N/O structure, instead of an O/N/O structure, is obtained.

Test Results

A first group of nitrides were atmospheric-pressure (AP) dry-oxidized (760 Torr) in pure oxygen ambient at 850° C. for 30 minutes. A second group of nitrides were atmospheric-pressure wet-oxidized (760 Torr) in pyrogenic ambient at 850° C. for 5 minutes. The third group of nitrides, according to the present invention, were low-pressure (LP) dry-oxidized in a pure oxygen ambient of 0.01 Torr to 76 Torr (preferably 0.5 Torr) at a temperature from 750° C. to 950° C. (preferably 850° C.) for approximately 10 to 60 minutes (preferably 30 minutes). Thereafter 2500 Å thick LPCVD polysilicon was deposited and subsequently POCl$_3$-diffused at 850° C. for 30 minutes, and thus MOS capacitors with the aforementioned various dielectric materials were fabricated to compare the effects of the LP dry-oxidation and AP dry and wet oxidation procedures. The effective oxide thickness of each stacked dielectric was determined by high-frequency CV measurements. The compositions of the dielectrics were checked by Auger electron spectrum (AES) depth profile and a step-by-step buffer-HF etching procedure.

Figure 2:
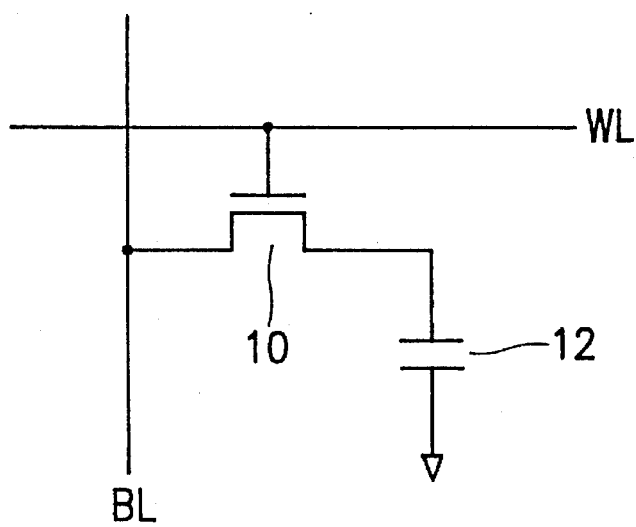
FIG. 2 is a schematic circuit diagram showing a conventional memory cell of a DRAM device.
Figure 3:
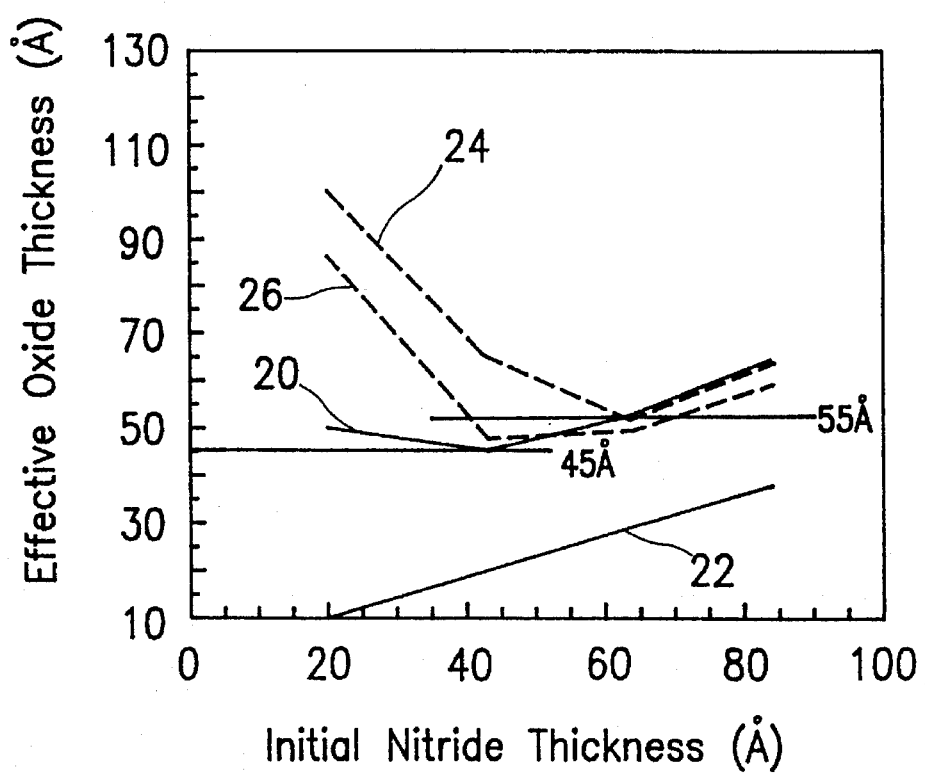
FIG. 3 shows the dependence of the effective oxide thickness of dielectric materials fabricated by oxidizing nitride layers with different oxidation schemes on the initial nitride thicknesses.

Referring now to FIG. 3, the dependence of the effective oxide thickness of the dielectrics fabricated by oxidizing the nitride layers with different oxidation schemes on the initial nitride thickness is shown, wherein the line 20 represents the LP dry-oxidized nitrides, the line 22 represents the pure nitrides, the dashed line 24 represents the AP wet-oxidized nitrides, and the dashed line 26 represents the AP dry-oxidized nitrides. FIG. 2 shows that the nitrides with initial thicknesses above 63 Å have similar oxidation resistances for all of the oxidation methods. The AP wet-oxidation 24 line shows a fast oxidation when the initial nitride thickness is below 60 Å. Similarly, the AP dry-oxidation 26 shows that the dielectrics display fast growth when the initial nitride thickness is as thin as 40 Å. In contrast, the LP dry-oxidation 20 line still indicates a mild oxidation, even as the initial nitride thickness is reduced below 40 Å. Therefore, the low-pressure dry oxidation can retard the fast growth of the oxidized nitrides as the initial nitride is thin and can obtain very high capacitance while used in DRAM cell capacitor.

Figure 4:
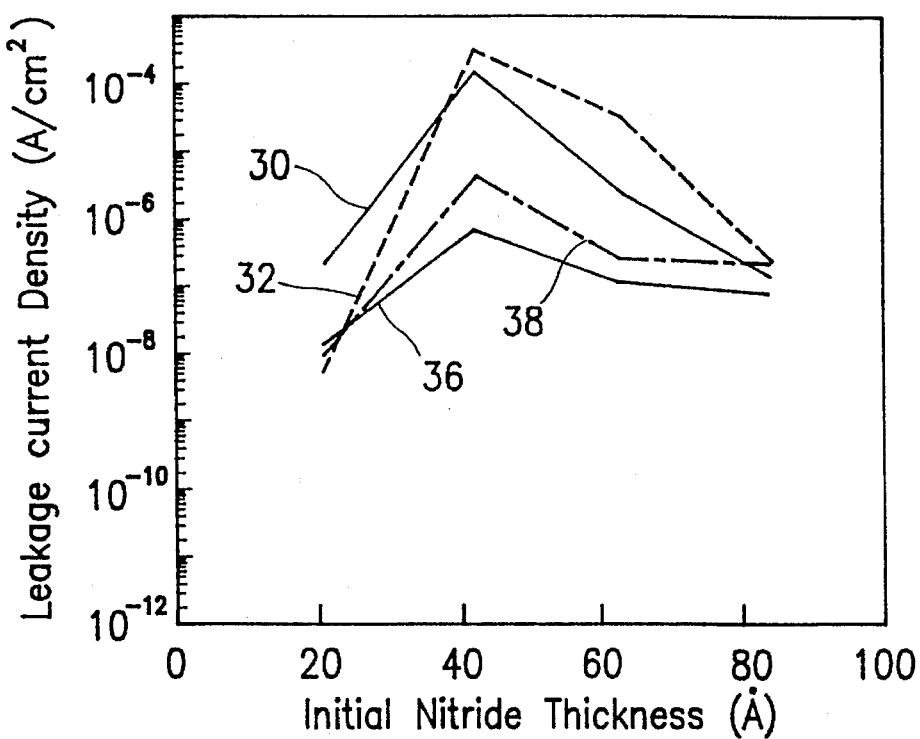
FIG. 4 shows the leakage current densities for dielectric materials fabricated by low-pressure (LP) and atmospheric-pressure (AP) dry-oxidation, respectively.

FIG. 4 shows the leakage current densities for the dielectrics fabricated by low-pressure (LP) and atmospheric-pressure (AP) dry-oxidation, wherein the line 30 represents the LP dry-oxidized nitrides measured at $V_g$=+3.3 V for the N-type wafers, the dashed line 32 represents the AP dry-oxidized nitrides measured at $V_g$=+3.3 V for the N-type wafers, the line 36 represents the LP dry-oxidized nitrides measured at $V_g$=−3.3 V for the P-type wafers, and the dashed line 38 represents the AP dry-oxidized nitrides measured at $V_g$=−3.3 V for the P-type wafers. Where the initial nitride thicknesses were between 40 Å and 60 Å, the leakage current densities of the LP dry-oxidized nitrides 30 and 36 were lower than those of the AP dry-oxidized nitrides 32 and 38 by at least 50 percent.

Figure 5:
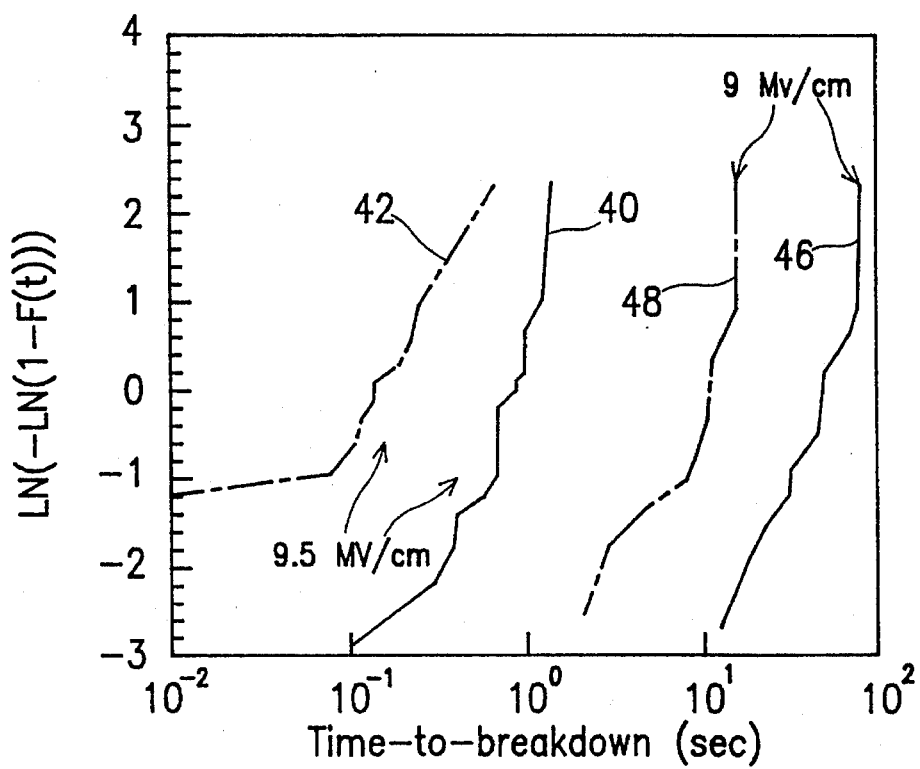
FIG. 5 shows the plots of time-to-breakdown for the AP and LP dry-oxidized nitride layers, respectively.

FIG. 5 is a Wiebull plot of time-to-breakdown for the AP and LP dry-oxidized nitride layers, wherein the line 40 represents the LP dry-oxidized nitrides measured at 9.5 MV/cm, the dashed line 42 represents the AP dry-oxidized nitrides measured at 9.5 MV/cm, the line 46 represents the LP dry-oxidized nitrides measured at 9 MV/cm, and the dashed line 48 represents the AP dry-oxidized nitrides measured at 9 MV/cm. As shown in FIG. 4, the LP dry-oxidized nitrides 40 and 46 exhibit higher reliabilities than the AP dry-oxidized nitrides 42 and 48. Weibull plots are described by D. L. Kwong et al, IRPS p. 323, 1991.

Figure 6:
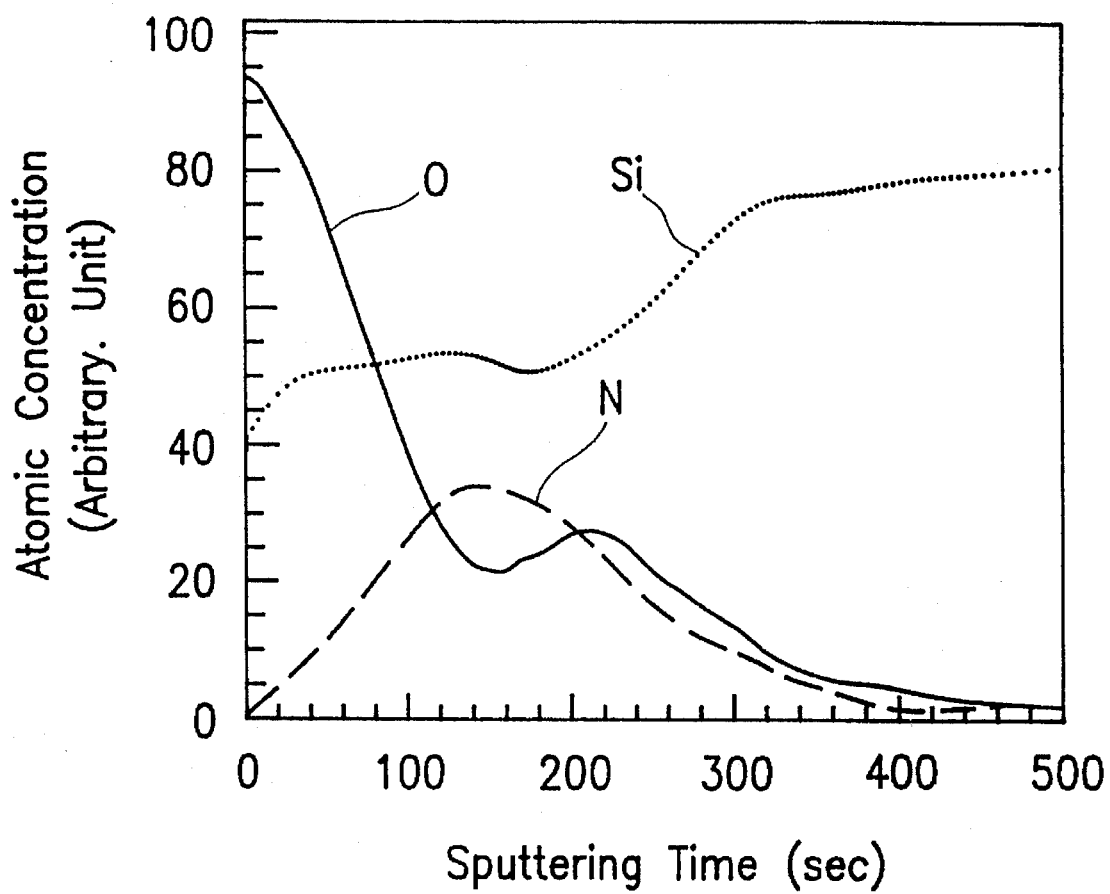
FIG. 6 shows the Auger electron spectrum (AES) depth profile of the dielectric formed after LP dry-oxidation in accordance with the present invention.

FIG. 6 shows an Auger electron spectrum (AES) depth profile of the dielectric formed after LP dry-oxidation in accordance with the present invention. There are two separated peaks for the oxygen atoms and one single peak for the nitrogen atom. These peaks represent the oxide/nitride/oxide (O/N/O) structure. In contrast, the dielectric materials formed after AP dry-oxidation are often nitride/oxide (N/O) structures.

Figure 7:
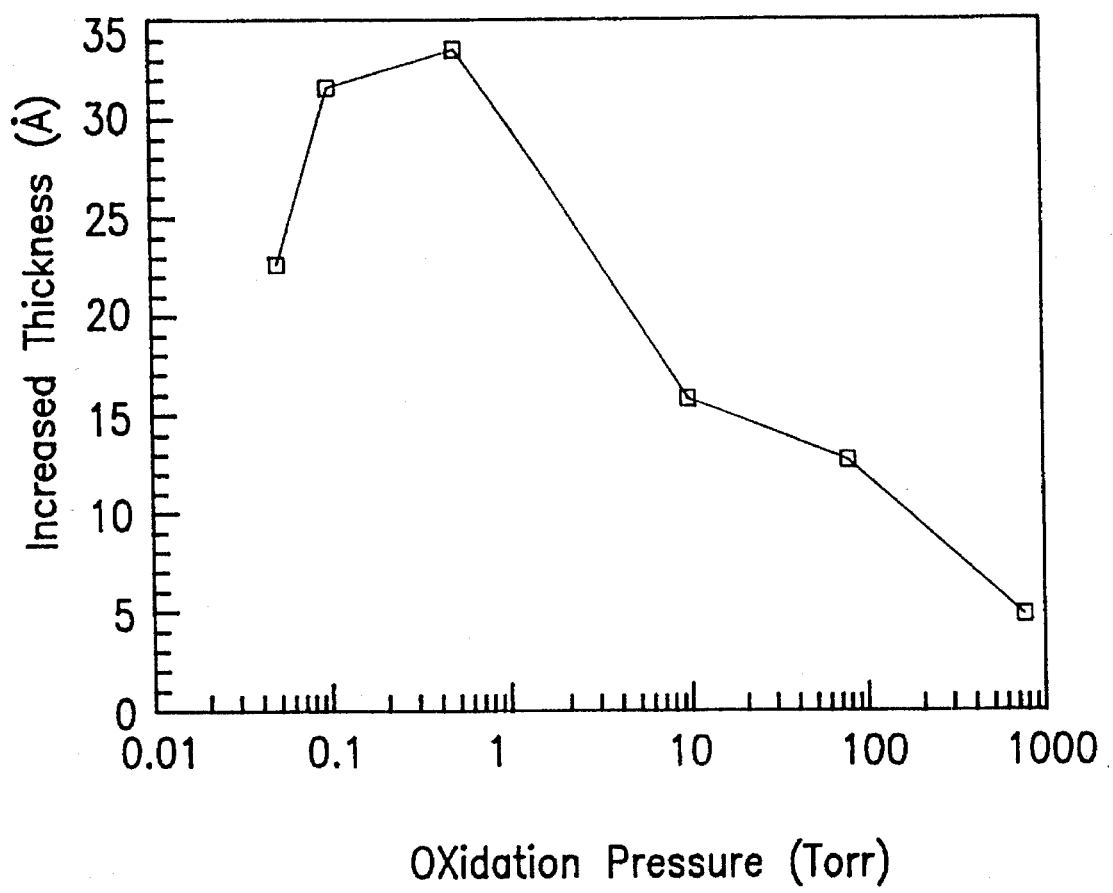
FIG. 7 is a plot of increased oxidation thickness versus oxidation pressure.

Ranges for the oxidation times, oxidation pressures and oxidation temperatures are provided above. Those skilled in the art will appreciate that as the temperature is increased then the corresponding time can be decreased. FIG. 7 shows the relationship of the thickness differences of the oxidized nitride 120 and the initial nitride 110, which referred as "increased thickness", versus oxidation pressure. As can be seen, the top layer oxide 123 growth occurs in a pressure range from about 0.1 to about 76 Torr. The testing done has been done primarily at 0.1 Torr, but from FIG. 7 it appears that about 0.5 Torr may be closer to optimum and therefor that value is listed as being preferred above.

If too much oxidation is allowed to occur (i.e. for too long a time or at too high a temperature) then the nitride layer will be destroyed and turned into an oxynitride film as opposed to the desired O/N/O structure. If too little oxidation occurs (i.e. for too short a time or at too low a temperature or at an improper pressure), the top layer 123 of oxide will not form.

Those practicing the present invention will discover that for each starting thickness of nitride layer 110 a corresponding optimum oxidation time and temperature can be determined in order to form the desired O/N/O structure. A preferred embodiment is set forth above and those skilled in the art may wish to deviate from the preferred thicknesses, time, pressures and temperatures in order to suit better their purposes.

In summary, dielectric materials formed after LP dry-oxidation in accordance with the present invention have decreased effective oxide thickness (to below 45 Å), and exhibit excellent electrical characteristics of low leakage current and high reliability. Hence, the disclosed method is particularly suitable for fabricating the dielectric layers of memory cells in high-density D-RAMS.

While the invention has been particularly shown and described with reference to the preferred embodiments thereof, it will be understood by those skilled in the art that various changes in form and details may be made without departing from the spirit and scope of the invention. It therefore should he pointed out that the above description based on the described embodiment of the invention is only to describe the invention, not to limit the scope of the invention, which is defined in the claims below.

What is claimed is:

1. A method of fabricating an O/N/O stacked dielectric on a silicon substrate, comprising the steps of:

(a) forming a nitride layer on a surface of said silicon substrate wherein said nitride layer has a thickness between 20 Å and 60 Å; and (b) oxidizing said nitride layer in pure oxygen ambient of 0.01 Torr to 76 Torr at a temperature between 750° C. and 950° C. for approximately 10 to 60 minutes to form an oxide/nitride/oxide (O/N/O) stacked dielectric on said substrate.

2. The method of claim 1 wherein said nitride layer has a thickness of approximately 42 Å and is oxidized at a temperature of approximately 850° C. for approximately 30 minutes at approximately 0.1 Torr.

* * * * *